US012477052B2

(12) United States Patent
Gao

(10) Patent No.: US 12,477,052 B2
(45) Date of Patent: Nov. 18, 2025

(54) TERMINAL DEVICE

(71) Applicant: HONOR DEVICE CO., LTD., Shenzhen (CN)

(72) Inventor: Man Gao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/924,238

(22) PCT Filed: Apr. 29, 2022

(86) PCT No.: PCT/CN2022/090338
§ 371 (c)(1),
(2) Date: Nov. 9, 2022

(87) PCT Pub. No.: WO2023/273588
PCT Pub. Date: Jan. 5, 2023

(65) Prior Publication Data
US 2024/0171666 A1    May 23, 2024

(30) Foreign Application Priority Data

Jul. 1, 2021  (CN) .......................... 202110749171.4

(51) Int. Cl.
*H04M 1/02* (2006.01)
*H05K 5/06* (2006.01)

(52) U.S. Cl.
CPC ....... *H04M 1/0277* (2013.01); *H04M 1/0274* (2013.01); *H05K 5/069* (2013.01)

(58) Field of Classification Search
CPC ... H04M 1/0277; H04M 1/0274; H05K 5/069
See application file for complete search history.

(56) References Cited

U.S. PATENT DOCUMENTS 8,243,458 B2    8/2012  Chen et al.
9,449,204 B1 *  9/2016  Chen .................... G07F 7/0873
(Continued)

FOREIGN PATENT DOCUMENTS

CN    102005666 A    4/2011
CN    102386518 A    3/2012
(Continued)

OTHER PUBLICATIONS

Chen Ligen et al. "Waterproof Design of Access Cover on Trainer," Trainer. 2015(03) p. 10-13.
(Continued)

*Primary Examiner* — Justin Y Lee
(74) *Attorney, Agent, or Firm* — WOMBLE BOND DICKINSON (US) LLP

(57) ABSTRACT

A terminal device includes a housing, a circuit board, and an interface component. An isolation groove is formed in an inner wall of the housing. The isolation groove has a first opening, and the first opening is exposed to the housing. The interface component is sealed in the isolation groove through a sealing kit. The interface component is electrically connected to the circuit board, and an interface end of the interface component is exposed to the first opening. Due to isolation of the sealing kit in the isolation groove, it is difficult for liquid to overflow to the circuit board through the isolation groove, to implement a good waterproof effect of the terminal device.

12 Claims, 17 Drawing Sheets

(56) References Cited

U.S. PATENT DOCUMENTS

| | | | |
|---|---|---|---|
| 10,027,052 B2 | 7/2018 | Yudate | |
| 2011/0051383 A1 | 3/2011 | Chen et al. | |
| 2015/0098200 A1* | 4/2015 | Spangberg | H05K 7/1427 361/752 |
| 2015/0195927 A1* | 7/2015 | Lee | G06F 1/1656 361/749 |
| 2018/0062689 A1 | 3/2018 | Xu et al. | |
| 2018/0277985 A1 | 9/2018 | Tsai | |
| 2020/0178411 A1 | 6/2020 | Pham et al. | |

FOREIGN PATENT DOCUMENTS

| | | |
|---|---|---|
| CN | 102843889 A | 12/2012 |
| CN | 203055747 U | 7/2013 |
| CN | 106415943 A | 2/2017 |
| CN | 206181117 U | 5/2017 |
| CN | 206181146 U | 5/2017 |
| CN | 106848732 A | 6/2017 |
| CN | 107835280 A | 3/2018 |
| CN | 108173058 A | 6/2018 |
| CN | 108206366 A | 6/2018 |
| CN | 108206874 A | 6/2018 |
| CN | 108281843 A | 7/2018 |
| CN | 110716618 A | 1/2020 |
| CN | 111446585 A | 7/2020 |
| CN | 212967921 U | 4/2021 |
| CN | 113613446 A | 11/2021 |
| DE | 10221303 A1 | 11/2003 |
| JP | 2008219447 A | 9/2008 |

OTHER PUBLICATIONS

Gu Yanbo, "Waterproof and sealed design of ground reconnaissance and intelligence equipment," Radio Communications Technology. 2001(05) p. 60-61.

* cited by examiner

TERMINAL DEVICE

CROSS-REFERENCE TO RELATED APPLICATIONS

This application is a national stage of International Application No. PCT/CN2022/090338, filed on Apr. 29, 2022, which claims priority to Chinese Patent Application No. 202110749171.4, filed on Jul. 1, 2021, both of which are incorporated herein by reference in their entireties.

TECHNICAL FIELD

This application relates to the field of communication device technologies, and in particular, to a terminal device.

BACKGROUND

As people have diversified requirements for application scenarios of terminals such as a mobile phone, a tablet, and a notebook computer, waterproof and sealing performance indicators of the terminals are also continuously improving. A waterproof and sealing level of a terminal that is positioned as a high-end product even needs to reach at least an IPX7 level.

However, a waterproof and sealing design that can reach at least the IPX7 level is usually implemented by improving waterproof and sealing performance of components such as an interface component exposed to a housing of a terminal. This also leads to high waterproof and sealing costs of the terminal, and is not conducive to controlling manufacturing costs of the terminal.

SUMMARY

An objective of embodiments of this application is to provide a terminal device, to implement a high waterproof and sealing level at low costs.

To achieve the above objective, a technical solution used in this application is that: A terminal device includes a housing, a circuit board, and an interface component. The circuit board is disposed in the housing. An isolation groove is formed in an inner wall of the housing. The isolation groove has a first opening, and the first opening is exposed to the housing. The interface component is sealed in the isolation groove through a sealing kit. The interface component is electrically connected to the circuit board, and an interface end of the interface component is exposed to the first opening.

Since the isolation groove is formed in the inner wall of the housing of the terminal device provided in this embodiment of this application, and the interface component is sealed in the isolation groove, a separate assembly space independent of the circuit board is formed in the isolation groove in the housing. Moreover, since the interface component is sealed in the isolation groove, a good waterproof effect is implemented between the interface component and the circuit board. In this case, even if liquid infiltrates the interface component from an interface end exposed to the housing, due to isolation of the sealing kit in the isolation groove, it is difficult for the liquid to overflow from the isolation groove to the circuit board, so that a good waterproof effect of the terminal device is implemented, and a waterproof and sealing level of the terminal device can reach at least an IPX7 level. However, a waterproof solution of the terminal device is implemented by forming the isolation groove in the inner wall of the housing, and sealing the interface component in the isolation groove. Because waterproof performance of the interface component is not required, the interface component may be a non-waterproof component, so that waterproof and sealing costs of the terminal device are well reduced, and the terminal device implements a good waterproof and sealing effect at low costs.

Optionally, a frame may be disposed in the housing, and the circuit board is fixed in the frame. The isolation groove is enclosed with an outer wall of the frame and the inner wall of the housing.

Optionally, the isolation groove has a second opening, and the second opening is located inside the housing. The sealing kit includes a sealing plate, and the sealing plate covers the second opening and is configured to seal the second opening.

Optionally, the sealing plate includes a main body and engaging lugs. The main body is disposed at the second opening. A gap is formed between a peripheral edge of the main body and a groove wall of the isolation groove, and the gap is filled with a waterproof glue. The engaging lugs are connected to an edge of the main body and are connected to the circuit board through screws.

Optionally, a support stand is disposed at a position that is on the groove wall of the isolation groove and that is close to the second opening, and the peripheral edge of the main body is disposed on the support stand. The engaging lugs may be flake-like objects and are connected to the edge of the main body, and the engaging lugs may be integrally formed with the main body.

For example, the waterproof glue may be filled in the gap between the main body and the groove wall of the isolation groove, and may also be filled in the isolation groove at the same time, so that the interface component may be better sealed in the isolation groove.

For example, the support stand may be suspended on the groove wall of the isolation groove, so that the support stand may not occupy assembly space inside the isolation groove, thereby leaving enough space for mounting the interface component in the isolation groove.

Optionally, the support stand may alternatively be formed by forming a step at a position that is on the groove wall of the isolation groove and that is close to the second opening. In this case, when the support stand presses against the main body, stability of supporting the main body can be well improved.

Optionally, the sealing plate includes a main body and engaging lugs. The main body is disposed at the second opening. A support stand is disposed at a position that is on the groove wall of the isolation groove and that is close to the second opening, and a peripheral edge of the main body is disposed on the support stand. A first caulking groove is disposed on a surface of the support stand, and a first sealing strip is disposed in the first caulking groove. The first sealing strip presses against a surface that is of the main body and that faces the isolation groove. The engaging lugs are connected to the edge of the main body and are connected to the circuit board through screws. The engaging lugs are connected to the circuit board through the screws. In this way, when the first sealing strip applies an elastic force to press against the main body, the engaging lugs can provide a reactive force for the main body, so that the main body steadily presses against the first sealing strip.

Optionally, a projection is formed on the inner wall of the housing, and the isolation groove is disposed in the projection. The projection is formed on the inner wall of the housing, and the isolation groove is disposed in the projection. In this way, the projection only occupies local space of the housing, and assembly space of an electrical component inside the housing is not affected. In addition, there is no need to increase thickness of a side wall of the housing, to well reduce manufacturing costs of the housing.

Optionally, the sealing plate includes the main body and the engaging lugs. The main body covers the second opening. The peripheral edge of the main body and a position that is on the projection and that is located at a peripheral edge of the second opening are hermetically connected. The engaging lugs are connected to the edge of the main body and are connected to the circuit board through the screws.

Optionally, the main body and the position that is of the projection and that is located at the peripheral edge of the second opening are hermetically connected through the waterproof glue.

Optionally, a second caulking groove is disposed at a position that is on the projection and that is at the peripheral edge of the second opening. A second sealing strip is disposed in the second caulking groove, and the second sealing strip presses against the surface that is of the main body and that faces the isolation groove.

Optionally, the interface component has a flexible printed circuit, where the flexible printed circuit extends out of the isolation groove through a gap between the main body and the circuit board and is connected to a board to board connector of the circuit board.

Optionally, a quantity of the engaging lugs is two, and two engaging lugs are respectively connected to edges of two opposite sides of the main body.

Optionally, the two engaging lugs are respectively located at two opposite ends of a diagonal line of the main body.

Optionally, the sealing kit includes a sealing glue, and the sealing glue is filled in the isolation groove. The interface component is sealed in the sealing glue.

Optionally, the interface component is a universal serial bus interface.

BRIEF DESCRIPTION OF DRAWINGS

To describe technical solutions in embodiments of this application more clearly, the following briefly describes accompanying drawings required in descriptions of the embodiments or conventional technology. Obviously, the accompanying drawings described in the following are merely some embodiments of this application. A person of ordinary skill in the art may also obtain other accompanying drawings based on these accompanying drawings without creative efforts.

DESCRIPTION OF REFERENCE NUMERALS

Figure 1:
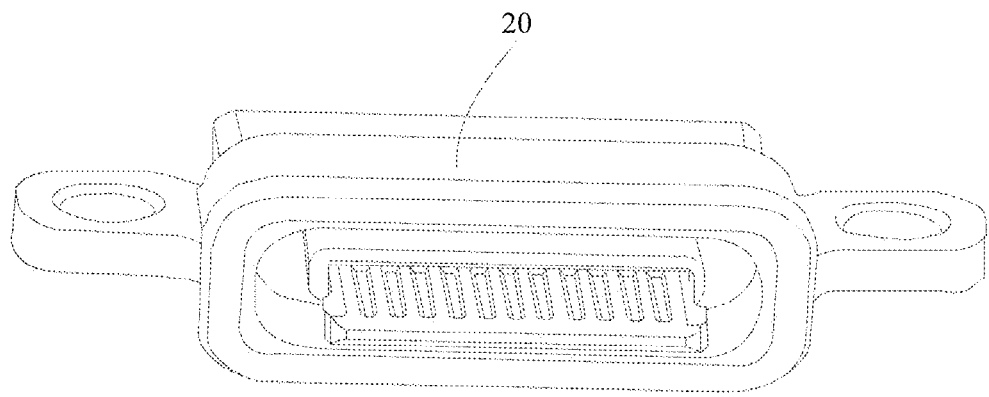
FIG. 1 is a schematic diagram of a structure of an existing interface.

10—terminal device,
11—housing,
12—projection,
13—isolation groove,
14—interface component,
15—sealing kit,
16—screw,
20—existing interface,
30—existing FPC board,
111—frame,
112—circuit board,
113—notch,
114—clearance,
115—bezel,
121—gap,
122—support stand,
123—first caulking groove,
124—first sealing strip,
125—second caulking groove,
126—second sealing strip,
131—first opening,
132—second opening,
141—interface end,
142—flexible printed circuit,
151—sealing plate,
152—main body, 153—engaging lug,
154—waterproof glue, and
155—sealing glue.

DESCRIPTION OF EMBODIMENTS

The following describes in detail the embodiments of this application, and examples of the embodiments are shown in the accompanying drawings. Identical or similar reference numerals always represent identical or similar components or components containing identical or similar functions. For example, the following embodiments described with reference to FIG. 3 to FIG. 21 are intended to explain this application and are not construed as a limitation on this application.

In the description of this application, it should be understood that an orientation or a positional relationship indicated by terms such as "length", "width", "above", "under", "front", "back", "left", "right", "vertical", "horizontal", "top", "bottom", "inside", and "outside" is an orientation or a positional relationship shown based on the accompanying drawings. The orientation or the positional relationship is only intended to facilitate and simplify the description of this application, but is not intended to indicate or imply that an apparatus or a component needs to have a specific orientation and be constructed and operated in a specific orientation. Therefore, the terms cannot be construed as a limitation on this application.

In addition, the terms "first" and "second" are only used for description and should not be understood as an indication or implication of relative importance or as an implicit indication of a quantity of indicated technical features. Therefore, a feature defined with "first" or "second" may explicitly or implicitly include one or more features. In the description of this application, "a plurality of" means two or more, unless otherwise specified.

In this application, unless otherwise specified and defined, terms such as "mount", "connected", "connect", and "fix" should be broadly understood, for example, may be understood as a fixed connection, a detachable connection, or an integer, may be understood as a mechanical connection, or an electrical connection, or may be understood as a direct connection, an indirect connection implemented by using an intermediate medium, an internal connection between two components, or an interaction relationship between two components. A person of ordinary skill in the art may understand specific meanings of the foregoing terms in this application based on specific cases.

To facilitate understanding for a reader, the following explains proper nouns used in this application:

A dustproof and waterproof standard (IPXX, International Protection XX) indicates a capability of an interface of preventing liquid and fixed particulate matters. X indicates a number. A first number following the letters "IP" indicates the capability of preventing fixed particulate matters, and a second number following the letters "IP" indicates a capability of preventing liquid.

A small board refers to a circuit board that is configured to mount functional components such as a speaker, a microphone, a light module, an antenna, an interface, and an adapter in a terminal device, for example, a mobile phone, and is usually located at the bottom of the terminal device, for example, a mobile phone.

A flexible printed circuit (FPC, Flexible Printed Circuit) refers to a printed circuit board with high reliability and flexibility, and has features of high wiring density, light weight, thin thickness, and good bendability.

A universal serial bus (USB, Universal Serial Bus) interface is a bus standard-based interface used for connection and communication between a terminal device and an external device.

A Type-C interface is a type of USB interface, has a small volume, and is usually used in a terminal device, for example, a mobile phone.

A board to board connector (BTB, Board to Board Connector) is mainly configured to connect a flexible printed circuit to a main board or a small board.

With development of technologies and diversity of people's entertainment lives and working scenarios, people hope that a terminal, for example, a mobile phone can achieve a good waterproof effect, so that the terminal is not easily damaged when washed by or immersed in liquid. Therefore, terminals that appear in recent years usually have high waterproof and sealing levels (for example, an IPX7 level). However, a waterproof and sealing design that can reach at least the IPX7 level is usually implemented by improving waterproof and sealing performance of a component exposed to a housing of a housing. For example, waterproof and sealing processing is performed on an existing interface 20 (as shown in FIG. 1), so that a terminal has good waterproof performance. Although this can improve the waterproof performance of the terminal, this also leads to high waterproof and sealing costs of the terminal, and is not conducive to controlling manufacturing costs of the terminal.

Figure 2:
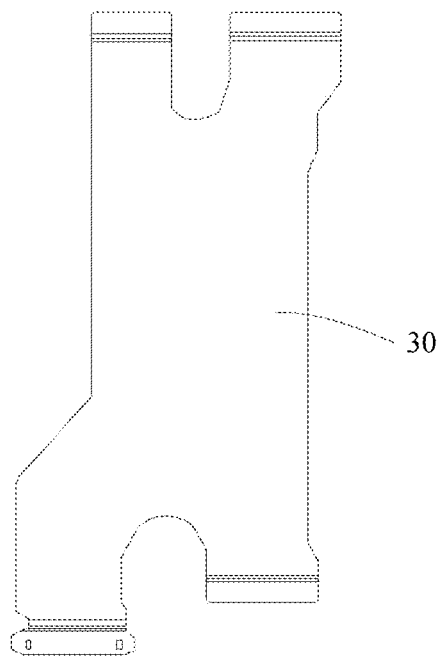
FIG. 2 is a schematic diagram of a structure of a flexible printed circuit connected to an existing interface.

In addition, in the conventional technology, the existing interface 20 and each component in a terminal share an existing FPC board 30 (as shown in FIG. 2). This makes it difficult to assemble the existing interface 20 in the terminal.

Therefore, an embodiment of this application provides a terminal device 10, to implement a high waterproof and sealing level at low costs. In this embodiment, the high waterproof and sealing level specifically refers to at least an IPX7 level.

Figure 3:
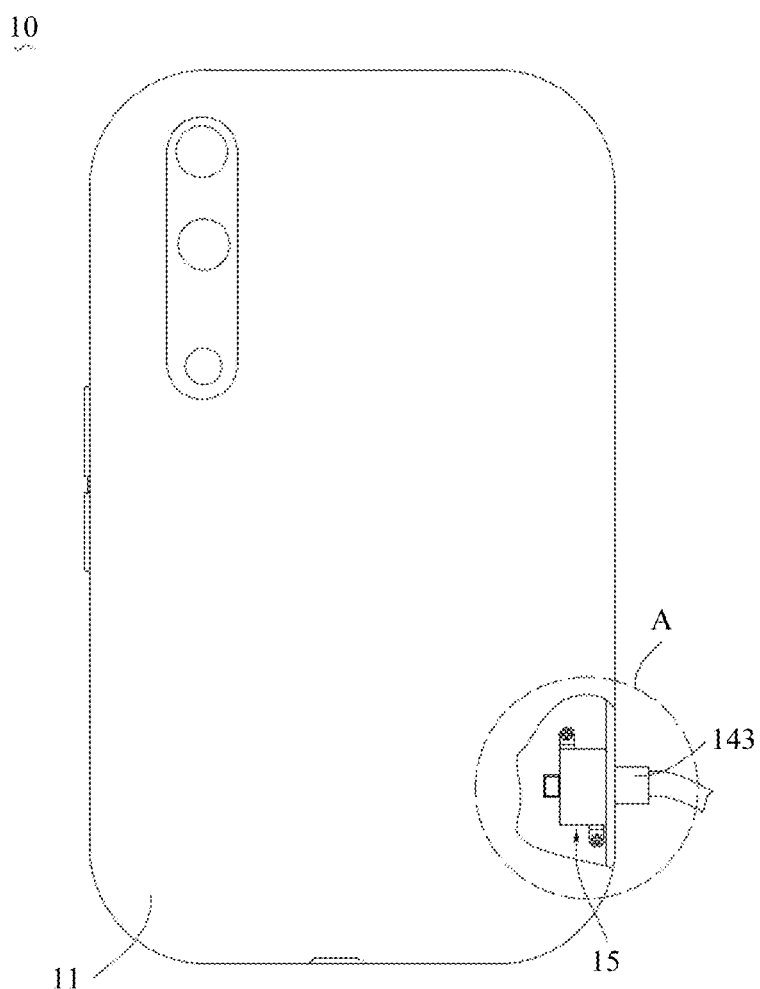
FIG. 3 is a schematic diagram of structure of a terminal device according to an embodiment of this application.
Figure 4:
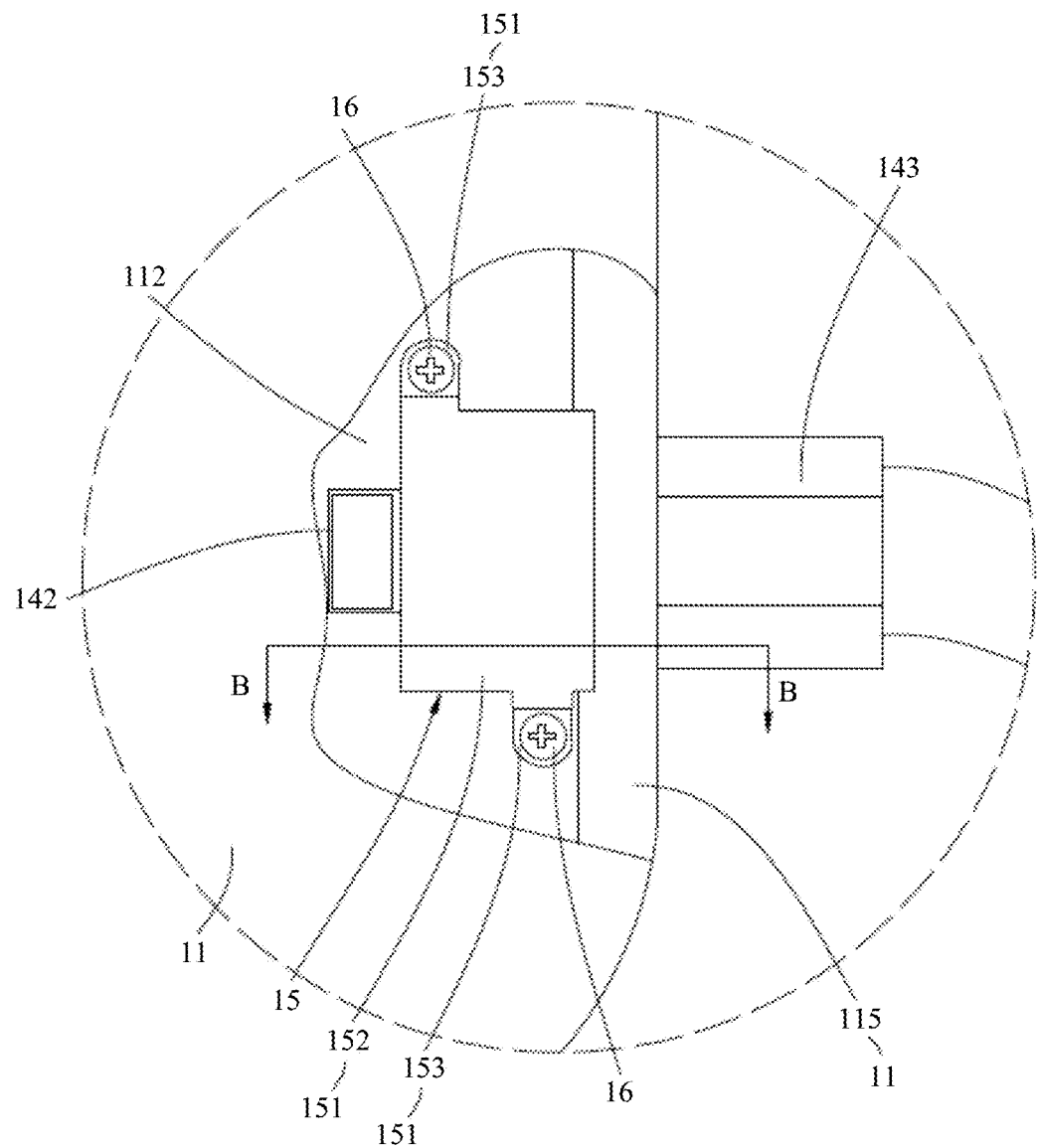
FIG. 4 is a locally enlarged schematic diagram of A in FIG. 3.
Figure 5:
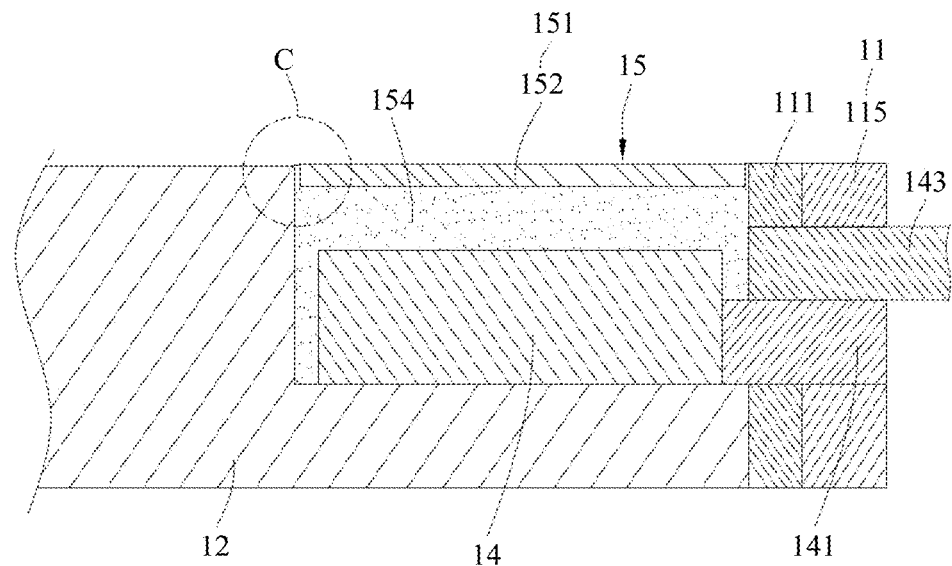
FIG. 5 is a partial section view along a B-B line in FIG. 4.

Specifically, as shown in FIG. 3 to FIG. 5, the terminal device 10 provided in this embodiment of this application includes a housing 11, a circuit board 112, and an interface component 14. In this embodiment, the terminal device 10 may be a mobile terminal device 10, for example, a mobile phone, a tablet, or a notebook computer, or may be a fixed terminal device 10, for example, a microcomputer, a workstation, a communication room data center, or a communication base station.

Figure 9:
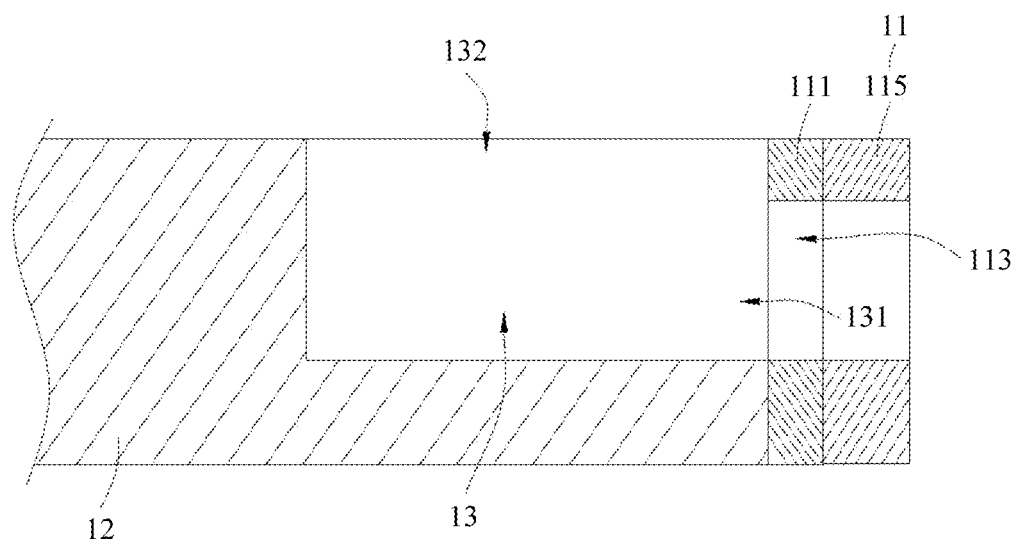
FIG. 9 is a section view of an isolation groove disposed in a projection in a terminal device in a thickness direction of the projection according to an embodiment of this application.
Figure 10:
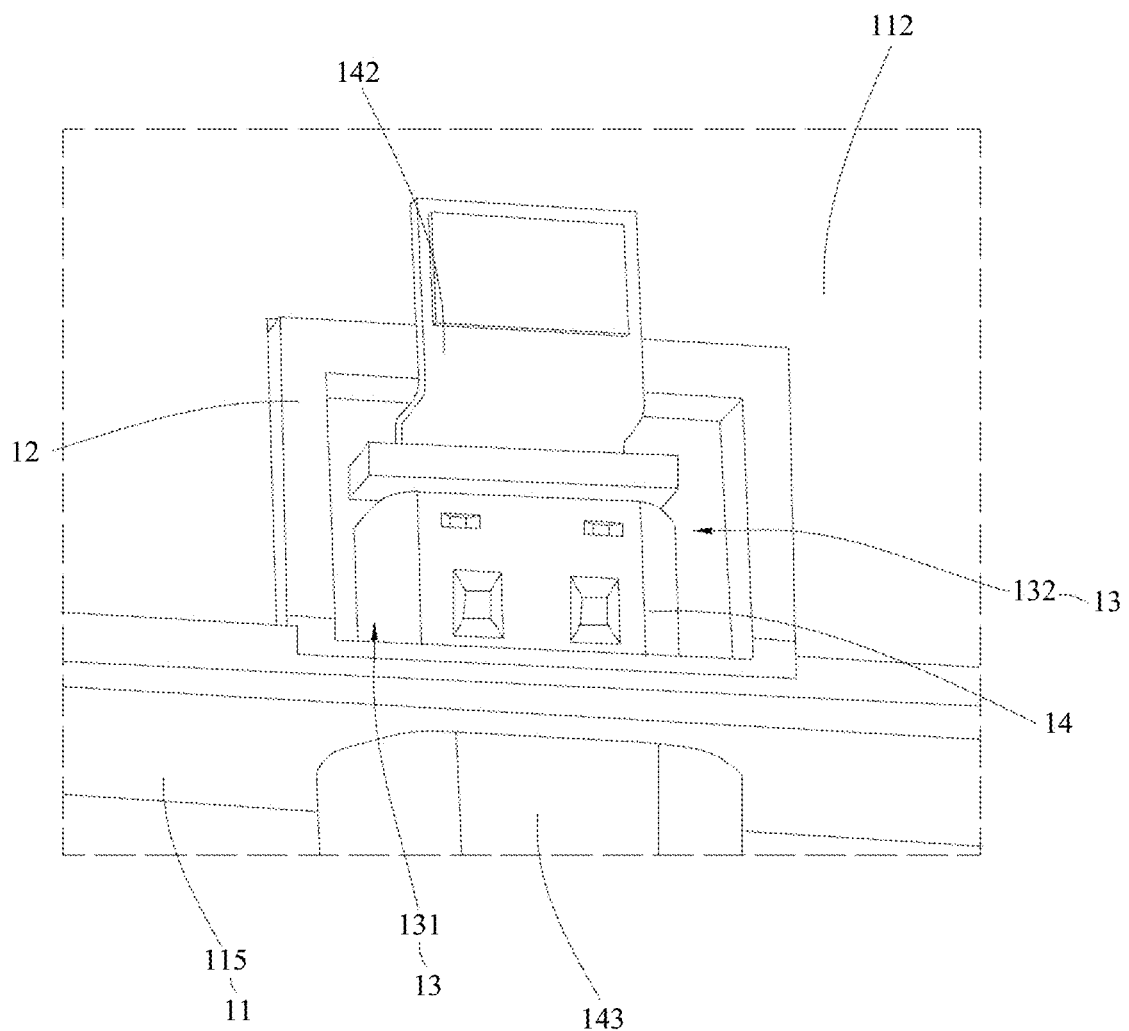
FIG. 10 is a schematic diagram of a partial structure of a projection and an interface component in a terminal device according to an embodiment of this application.

The housing 11 refers to an outer shell of the terminal device 10, or may refer to an internal housing of the terminal device 10. The circuit board 112 is disposed in the housing 11. In this embodiment, the circuit board 112 may be a small board in the terminal device 10. As shown in FIG. 9 and FIG. 10, an isolation groove 13 is formed in an inner wall of the housing 11, the isolation groove 13 has a first opening 131, and the first opening 131 is exposed to the housing 11. For example, the inner wall of the housing 11 may refer to a surface that is of a bezel 115 of the housing 11 and that faces inner space of the housing 11, or may refer to a surface that is of a bottom surface or the like of the housing 11 and that faces the inner space of the housing 11 when the housing 11 is placed horizontally.

Specifically, the first opening 131 of the isolation groove 13 may be disposed to face the bezel 115 of the housing 11. The interface component 14 is sealed in the isolation groove 13 through a sealing kit 15. The interface component 14 is electrically connected to the circuit board 112, and an interface end 141 of the interface component 14 is exposed to the first opening 131. In this embodiment, the interface component 14 may be a USB interface, a Micro-USB interface, a Type-C interface, or the like.

Figure 11:
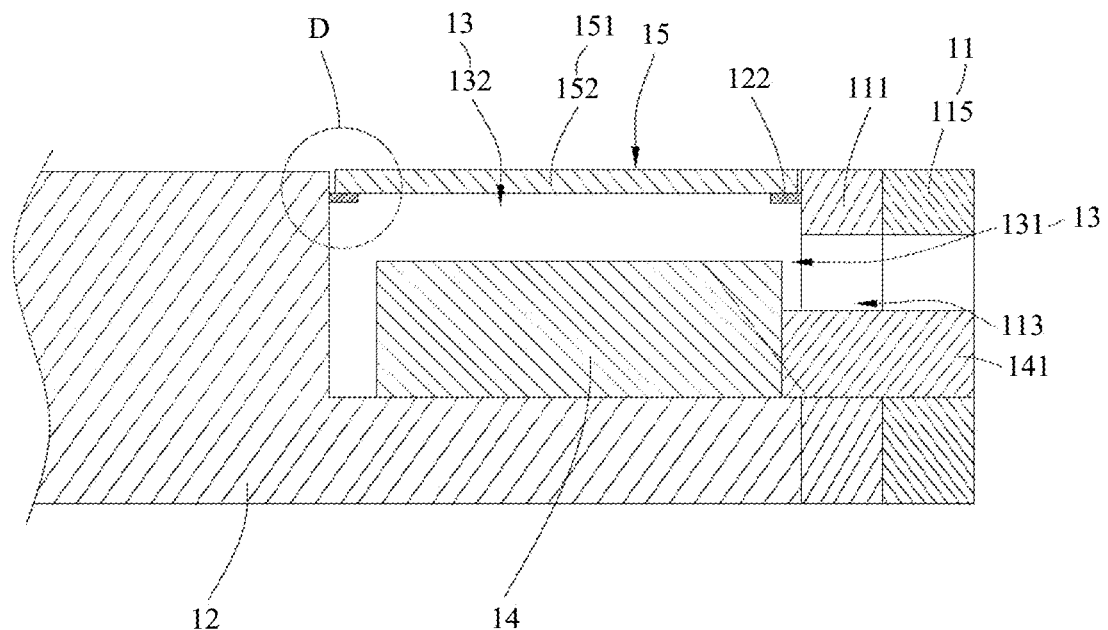
FIG. 11 is a second section view of a partial structure of a projection, a sealing plate, and an interface component in a terminal device in a thickness direction of the projection according to an embodiment of this application.

With reference to FIG. 4 and FIG. 11, the following further describes the terminal device 10 provided in this embodiment of this application. Since the isolation groove 13 is formed in the inner wall of the housing 11 of the terminal device 10 provided in this embodiment of this application, and the interface component 14 is sealed in the isolation groove 13, in the housing, a separate assembly space independent of the circuit board 112 is formed in the isolation groove 13. Moreover, since the interface component 14 is sealed in the isolation groove 13, a good waterproof effect is implemented between the interface component 14 and the circuit board 112. In this case, even if liquid infiltrates the interface component 14 from the interface end 141 exposed to the housing 11, due to isolation of the sealing kit 15 in the isolation groove 13, it is difficult for the liquid to overflow from the isolation groove 13 to the circuit board 112, so that a good waterproof effect of the terminal device 10 is implemented, and a waterproof and sealing level of the terminal device 10 can reach at least an IPX7 level. However, a waterproof solution of the terminal device 10 is implemented by forming the isolation groove 13 in the inner wall of the housing 11, and sealing the interface component 14 in the isolation groove 13. Because waterproof performance of the interface component 14 is not required, the interface component 14 may be a non-waterproof component, so that waterproof and sealing costs of the terminal device 10 are well reduced, and the terminal device 10 implements a good waterproof and sealing effect at low costs.

Figure 8:
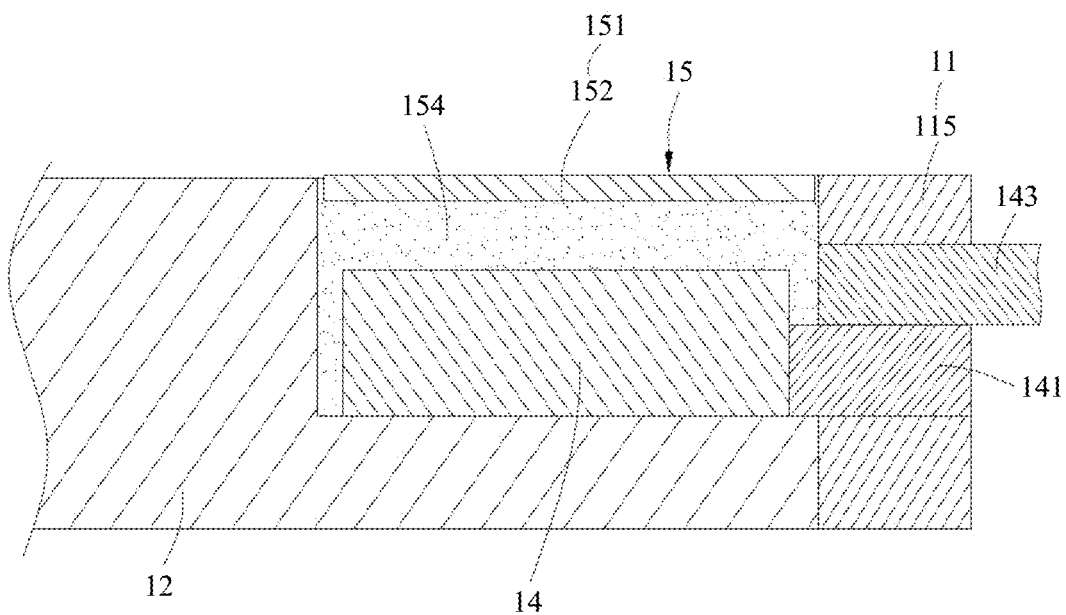
FIG. 8 is a first section view of a partial structure of a projection, a sealing plate, and an interface component in a terminal device in a thickness direction of the projection according to an embodiment of this application.

For example, as shown in FIG. 5 and FIG. 8, a frame 111 may be disposed on the inner wall of the housing 11, an outer wall of the frame 111 is attached to the inner wall of the housing 11, or the frame 111 is integrally formed with the housing 11. The isolation groove 13 may be formed in the inner wall of the housing 11, or may be formed in a wall surface of the frame 111. The circuit board 112 is fixed in the frame 111. A notch 113 (as shown in FIG. 9) is correspondingly disposed at a position that is of the frame 111 and the housing 11 and that corresponds to the first opening 131 of the isolation groove 13, and the interface end 141 of the interface component 14 is exposed to the notch 113, to be connected to an external device. Certainly, the housing 11 may be the only one disposed on the terminal device 10, and the isolation groove 13 is directly formed in the inner wall of the housing 11.

For example, as shown in FIG. 4, FIG. 5, and FIG. 9, the interface component 14 can be used together with an electrically connected plug 143 of the external device, and the electrically connected plug 143 may be plugged into the notch 113 and electrically contacted with the interface end 141 of the interface component 14, to implement signal transmission between the interface component 14 and the external device.

In some other embodiments of this application, as shown in FIG. 4 and FIG. 8 to FIG. 10, the isolation groove 13 has a second opening 132, and the second opening 132 is located in the housing 11. The sealing kit 15 includes a sealing plate 151, and the sealing plate 151 is disposed at the second opening 132 and is configured to seal the second opening 132. The sealing plate 151 may be sealed in the second opening 132, or may cover a peripheral edge of the second opening 132.

Specifically, in this embodiment, the sealing plate 151 is sealed in the second opening 132, so that sealing of the interface component 14 in the isolation groove 13 is simply and reliably implemented, and reliable isolation between the interface component 14 and the circuit board 112 in the housing 11 of the terminal is also implemented.

In addition, the second opening 132 also facilitates an electrical connection between a flexible printed circuit 142 of the interface component 14 and the circuit board 112 in the housing 11 of the terminal. Electrically connected components such as the flexible printed circuit 142 of the interface component 14 may pass through the second opening 132 and the sealing plate 151, to be electrically connected to the circuit board 112 in the housing 11 of the terminal.

Figure 6:
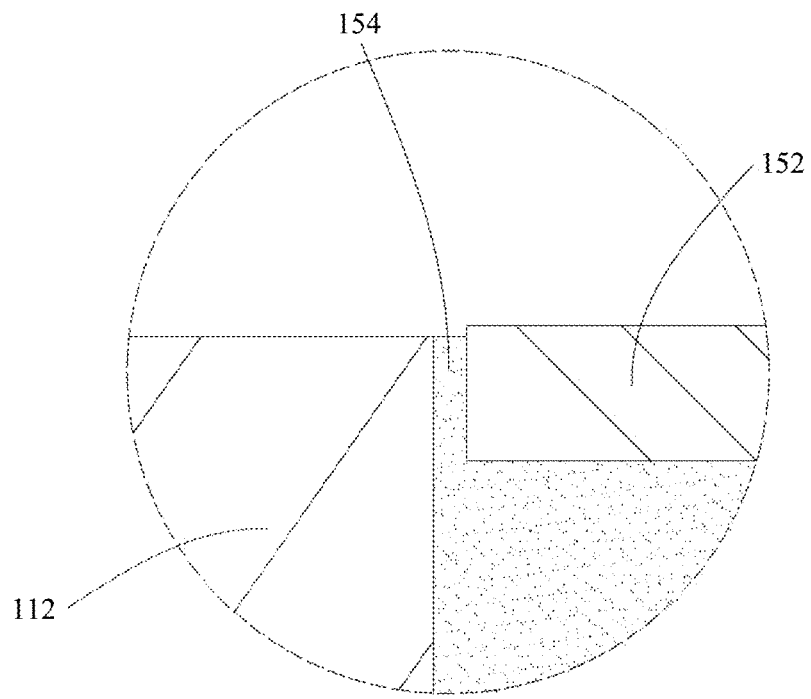
FIG. 6 is a locally enlarged view of C in FIG. 5.
Figure 7:
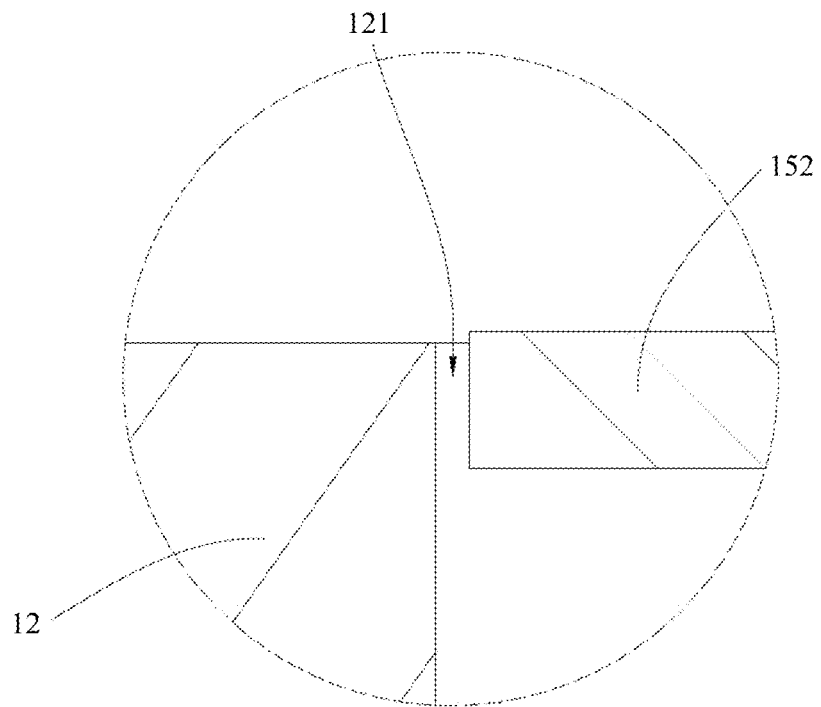
FIG. 7 is a locally enlarged view of a projection and a sealing plate in the terminal device shown in FIG. 5.

In some other embodiments of this application, as shown in FIG. 4 to FIG. 6, the sealing plate 151 includes a main body 152 and engaging lugs 153. The main body 152 is disposed at the second opening 132, and a gap 121 (as shown in FIG. 7) is formed between a peripheral edge of the main body 152 and a groove wall of the isolation groove 13. The gap 121 is filled with a waterproof glue 154 (as shown in FIG. 6), and the engaging lugs 153 are connected to an edge of the main body 152 and are connected to the circuit board 112 through screws 16.

Specifically, in this embodiment, as shown in FIG. 4, the sealing plate 151 specifically includes the main body 152 and the engaging lugs 153. In this embodiment, as shown in FIG. 5, the main body 152 may be completely disposed in the isolation groove 13, or may be semi-submerged in the isolation groove 13. In this case, an end surface on which the second opening 132 is disposed on a small board has good flatness, so that the sealing plate 151 does not occupy assembly space inside the housing 11, and this is conducive to a lightweight design of the terminal device 10.

The gap 121 between the main body 152 and the groove wall of the isolation groove 13 is filled with the waterproof glue 154, so that reliable sealing of the isolation groove 13 is implemented. The engaging lugs 153 are connected to the circuit board 112 through the screws 16, so that a reliable connection between the sealing plate 151 and the circuit board 112 is implemented, and the sealing plate 151 has better assembly stability in the housing 11 of the terminal.

For example, the waterproof glue 154 may be filled in the gap 121 between the main body 152 and the groove wall of the isolation groove 13, and may also be filled in the isolation groove 13, so that the interface component 14 can be better sealed in the isolation groove 13.

For example, the engaging lugs 153 may be flake-like objects connected to the edge of the main body 152, and the engaging lugs 153 may be integrally formed with the main body 152, so that connection strength between the engaging lugs 153 and the main body 152 may be improved, and overall manufacturing costs of the sealing plate 151 can be reduced.

Figure 12:
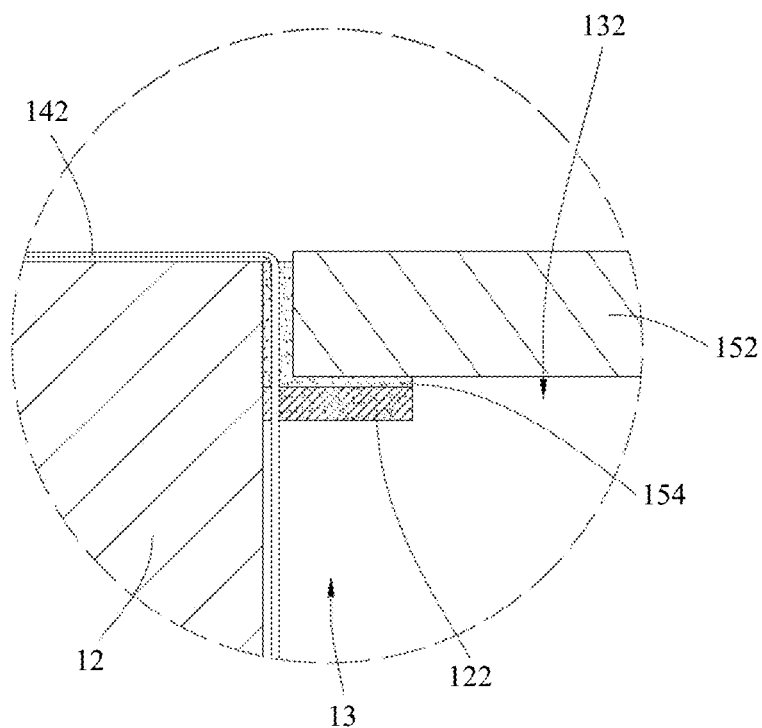
FIG. 12 is a locally enlarged view of D in FIG. 11.

In some other embodiments of this application, as shown in FIG. 11 and FIG. 12, a support stand 122 is disposed at a position that is on a groove wall of the isolation groove 13 and that is close to the second opening 132, and the peripheral edge of the main body 152 is disposed on the support stand 122. Specifically, the support stand 122 is disposed on the groove wall of the isolation groove 13. In this case, when the main body 152 is disposed in the isolation groove 13, the main body 152 can be stably limited in the isolation groove 13 through pressing of the support stand 122. In this case, the main body 152 can be limited in the isolation groove 13 without pressing the main body 152 against the interface component 14, thereby improving assembly stability of the main body 152 in the isolation groove 13.

For example, as shown in FIG. 12, the waterproof glue 154 may also be filled between the main body 152 and the support stand 122, so that the main body 152 and the support stand 122 have better connection strength, and sealing performance of the sealing plate 15 to the isolation groove 13 is also improved.

For example, as shown in FIG. 12, the support stand 122 may be suspended on the groove wall of the isolation groove 13, so that the support stand 122 may not occupy assembly space inside the isolation groove 13, thereby leaving enough space for mounting the interface component 14 in the isolation groove 13.

Optionally, the support stand 122 may alternatively be formed by forming a step at a position that is on the groove wall of the isolation groove 13 and that is close to the second opening 132. In this case, when the support stand 122 presses against the main body 152, stability of supporting the main body 152 can be well improved.

Figure 13:
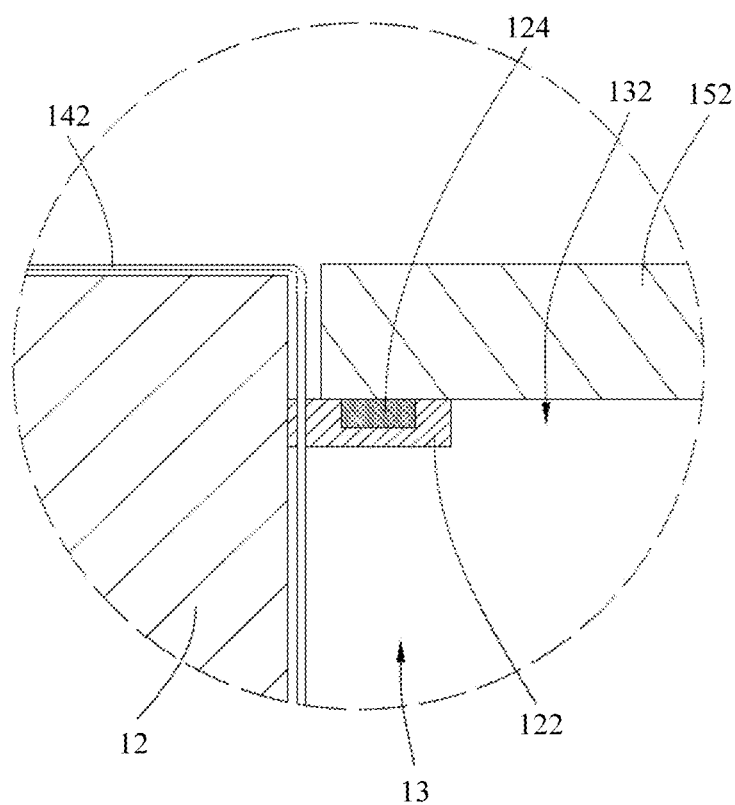
FIG. 13 is a first locally enlarged view of the projection and the sealing plate in the terminal device shown in FIG. 11.
Figure 14:
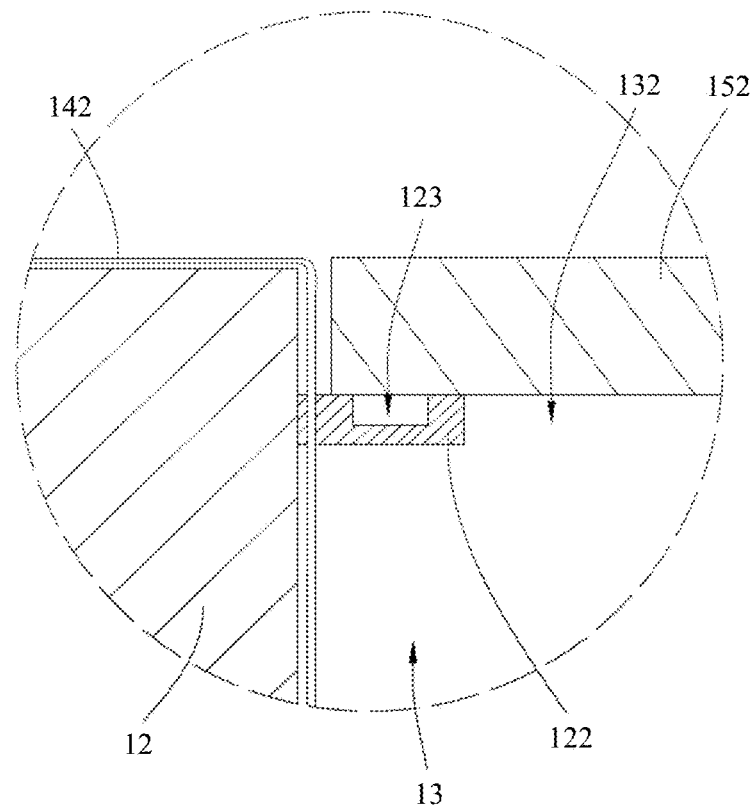
FIG. 14 is a second locally enlarged view of the projection and the sealing plate in the terminal device shown in FIG. 11.

In some other embodiments of this application, as shown in FIG. 11 to FIG. 14, the sealing plate 151 includes the main body 152 and the engaging lugs 153. The main body 152 is disposed at the second opening 132. The support stand 122 is disposed at the position that is on the groove wall of the isolation groove 13 and that is close to the second opening 132, and the peripheral edge of the main body 152 is disposed on the support stand 122. A first caulking groove 123 (as shown in FIG. 13) is disposed on a surface of the support stand 122, and a first sealing strip 124 (as shown in FIG. 14) is disposed in the first caulking groove 123. The first sealing strip 124 presses against a surface that is of the main body 152 and that faces the isolation groove 13. The engaging lugs 153 are connected to the edge of the main body 152 and are connected to the circuit board 112 through the screws 16.

Specifically, in this embodiment, the main body 152 and the isolation groove 13 may be sealed without the waterproof glue 154, but the first sealing strip 124 may be disposed in the first caulking groove 123 disposed on the surface of the support stand 122, so that the first sealing strip 124 presses against the main body 152. In this case, because the engaging lugs 153 are connected to the circuit board 112 through the screws 16, when the first sealing strip 124 applies an elastic force to press against the main body 152, the engaging lugs 153 can provide a reactive force for the main body 152, so that the main body 152 steadily presses against the first sealing strip 124, thereby implementing sealing of the isolation groove 13 by the main body 152. Therefore, the sealing plate 151 can be detachably connected to the circuit board 112, to facilitate removal and replacement of the sealing plate 151, and avoid use of the waterproof glue 154. Therefore, the terminal device 10 has lower waterproof implementation costs.

Figure 16:
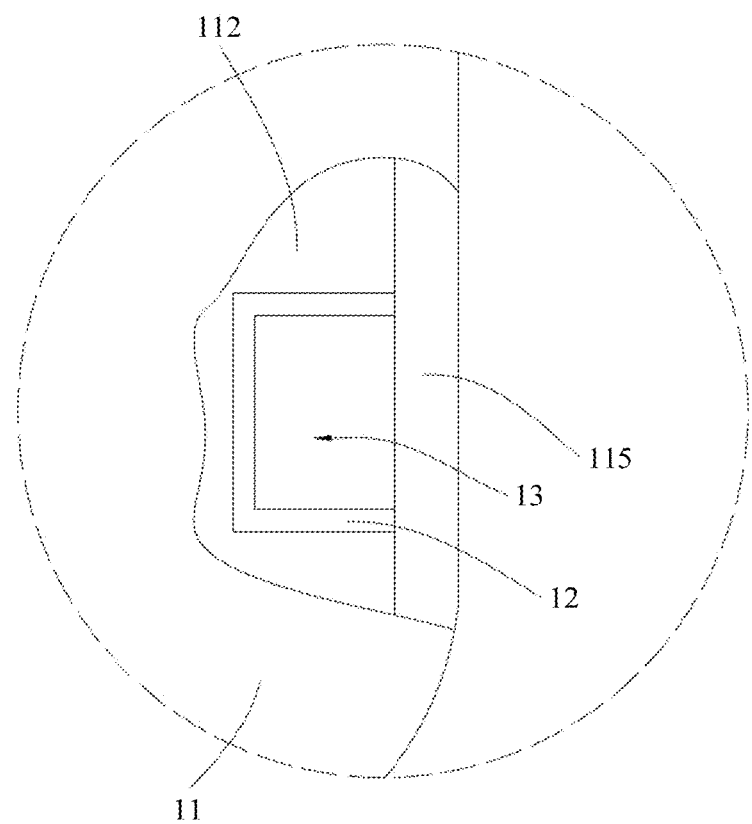
FIG. 16 is a schematic diagram of a partial structure of a housing, a circuit board, and a projection in a terminal device according to an embodiment of this application.

In some other embodiments of this application, as shown in FIG. 10 and FIG. 16, a projection 12 is formed on the inner wall of the housing 11, and the isolation groove 13 is disposed on the projection 12. Specifically, in other embodiments of this application, the isolation groove 13 may be directly disposed on the inner wall of the housing 11. In this case, the housing 11 needs to be sufficiently thick. However, if the thickness of the housing 11 is too thick, it is not conducive to control manufacturing costs of the housing, and the housing 11 occupies assembly space of an electronic component in the housing 11.

Figure 15:
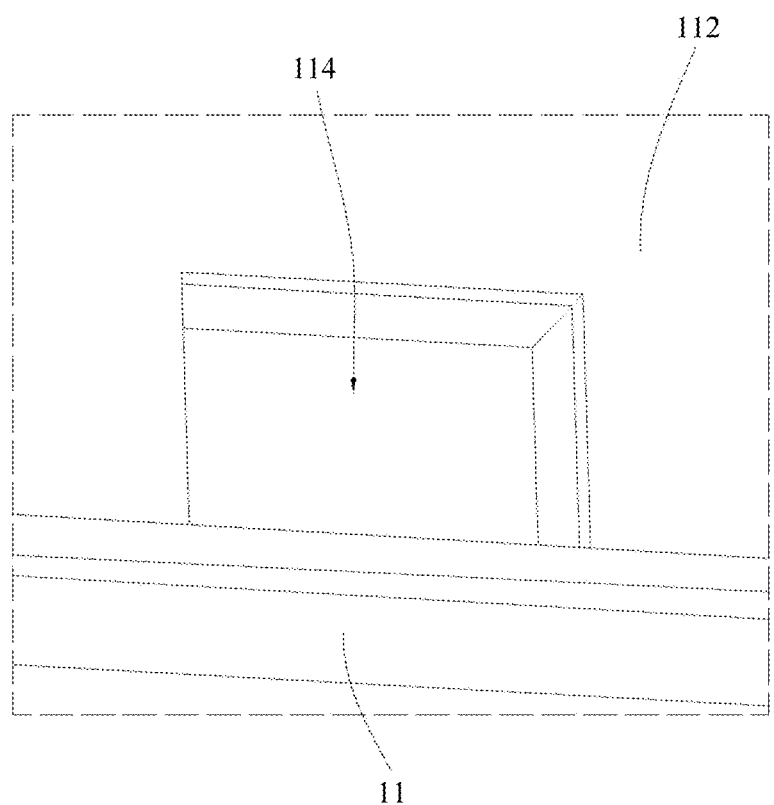
FIG. 15 is a schematic diagram of a partial structure of a housing and a circuit board in a terminal device according to an embodiment of this application.

However, in this embodiment, the projection 12 is formed on the inner wall of the housing 11, and then the isolation groove 13 is disposed in the projection 12. In this way, the projection 12 only occupies local space of the housing 11, and assembly space of the electrical component inside the housing 11 is not affected. In addition, there is no need to increase thickness of a side wall of the housing 11, to well reduce manufacturing costs of the housing 11. For example, the projection 12 and the housing 11 may be die-cast integrally, forged integrally, or injection molded integrally, so that strength of a junction between the projection 12 and the housing 11 can be improved, and manufacturing costs of the projection 12 and the housing 11 are reduced. For example, as shown in FIG. 15, a clearance configured to pass through the projection 12 is disposed on a circuit board 112.

Figure 17:
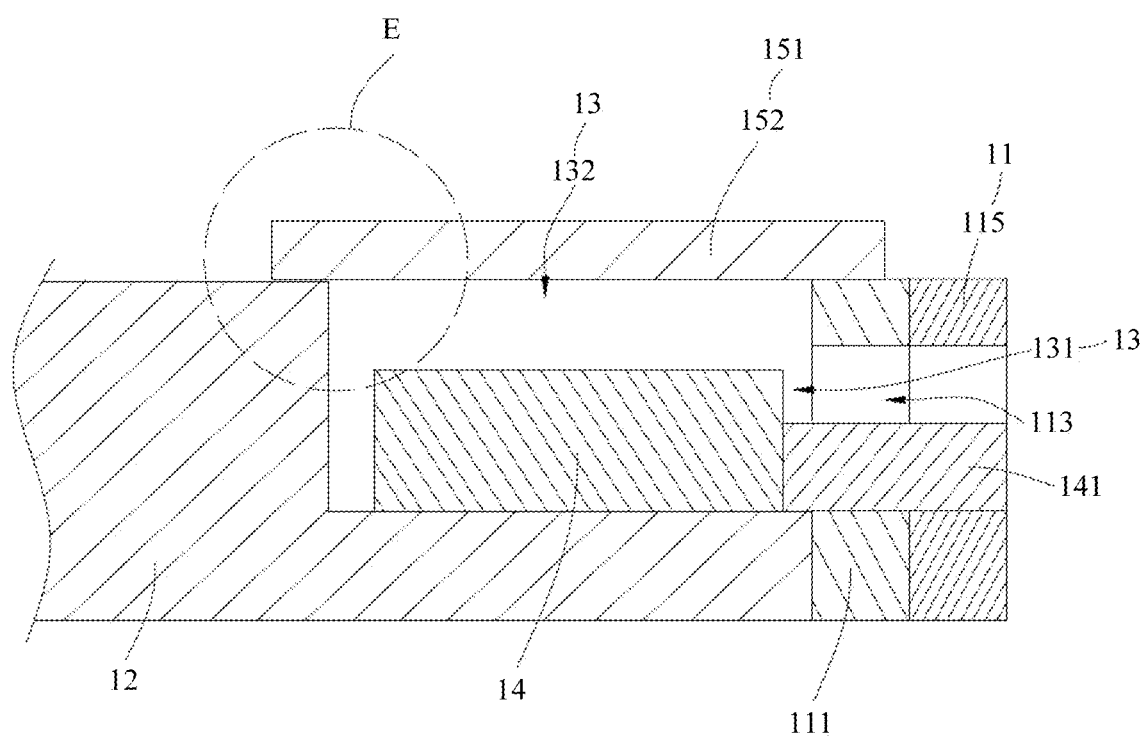
FIG. 17 is a third section view of a partial structure of a projection, a sealing plate, and an interface component in a terminal device in a thickness direction of the projection according to an embodiment of this application.

In some other embodiments of this application, as shown in FIG. 4 and FIG. 17, the sealing plate 151 includes the main body 152 and the engaging lugs 153. The main body 152 covers the second opening 132. The peripheral edge of the main body 152 and a position that is on the projection 12 and that is located at the peripheral edge of the second opening 132 are hermetically connected. The engaging lugs 153 are connected to the edge of the main body 152 and are connected to the circuit board 112 through the screws 16.

Specifically, in this embodiment, the main body 152 covers the second opening 132. To be specific, the main body 152 completely covers the second opening 132, instead of being disposed in the second opening 132. In addition, the peripheral edge of the main body 152 and the position that is on the projection 12 and that is located at the peripheral edge of the second opening 132 are hermetically connected, thereby implementing sealing of the isolation groove 13 by the main body 152. The main body 152 does not need to be disposed in the isolation groove 13, so that a strict requirement for dimensional tolerance of the main body 152 may be avoided, processing difficulty of the main body 152 is reduced, and processing and manufacturing costs of the main body 152 are reduced.

Figure 18:
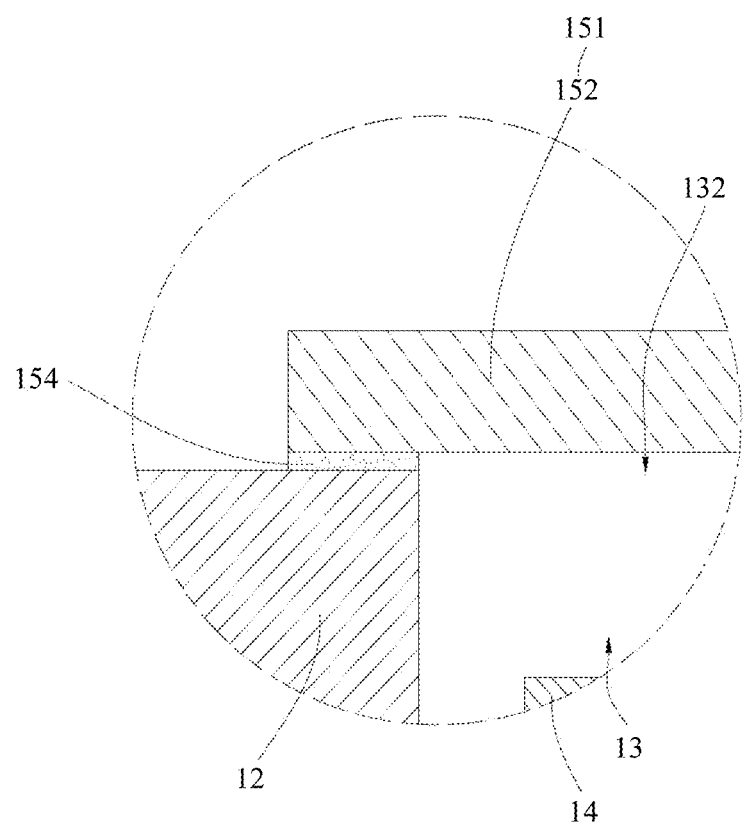
FIG. 18 is a locally enlarged view of E in FIG. 17.

In some other embodiments of this application, as shown in FIG. 18, the main body 152 and the position that is of the projection 12 and that is located at the peripheral edge of the second opening 132 are hermetically connected through the waterproof glue 154. Specifically, a peripheral edge of the main body 152 and a circuit board 112 and the peripheral edge of the second opening 132 are sealed through a glue dispensing operation of the waterproof glue 154. The waterproof glue 154 may be simply distributed in a position that is of the projection 12 and that is located at the peripheral edge of the second opening 132, or may be completely filled in the isolation groove 13.

Figure 19:
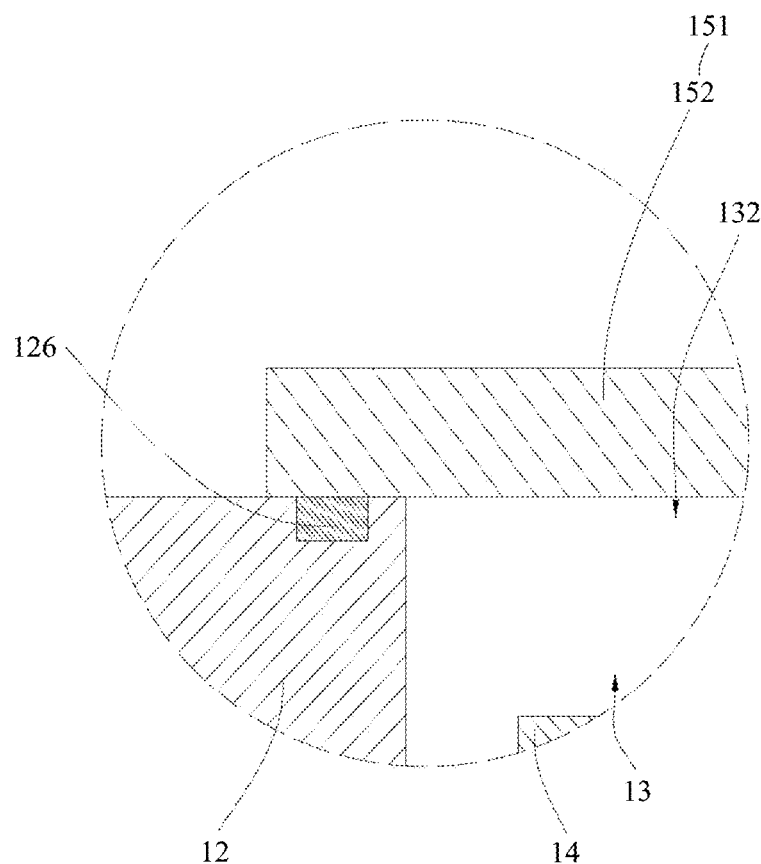
FIG. 19 is a first locally enlarged view of a projection and a sealing plate in the terminal device shown in FIG. 17.
Figure 20:
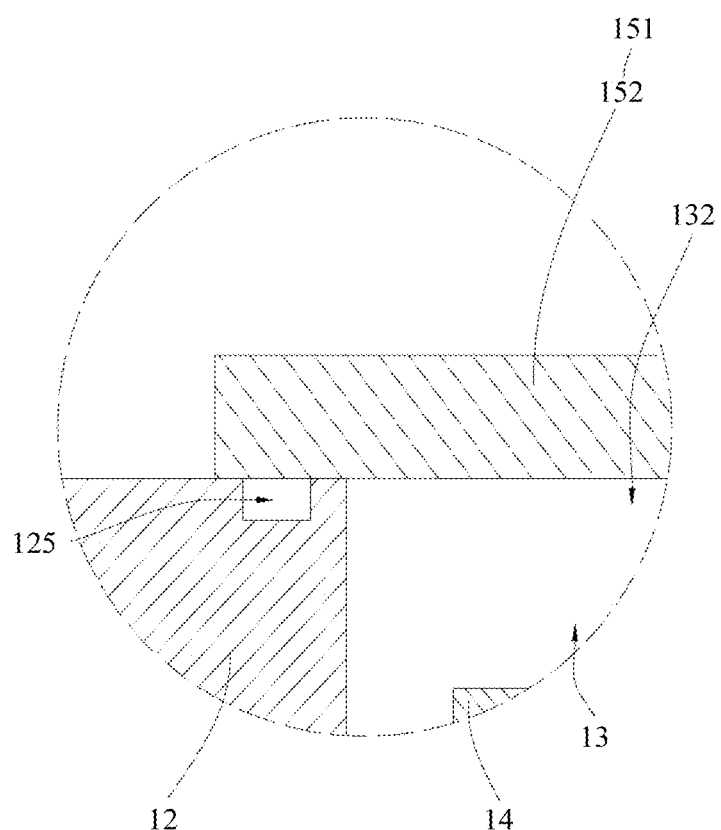
FIG. 20 is a second locally enlarged view of the projection and the sealing plate in the terminal device shown in FIG. 17.

In some other embodiments of this application, as shown in FIG. 19 and FIG. 20, a second caulking groove 125 is disposed at a position that is on the projection 12 and that is at the peripheral edge of the second opening 132. A second sealing strip 126 is disposed in the second caulking groove 125, and the second sealing strip 126 presses against the surface that is of the main body 152 and that faces the isolation groove 13.

Specifically, in this embodiment, the main body 152 of the sealing plate 151 may be hermetically connected to the projection 12 through pressing of the second sealing strip 126. Therefore, the sealing plate 151 can be detachably connected to the projection 12, to facilitate removal and replacement of the sealing plate 151, and avoid use of the waterproof glue 154, so that the terminal device 10 has lower waterproof implementation costs.

In some other embodiments of this application, as shown in FIG. 4, a quantity of engaging lugs 153 is two, and two engaging lugs 153 are respectively connected to edges of two opposite sides of the main body 152. Specifically, in this embodiment, the quantity of the engaging lugs 153 is limited to two, and the two engaging lugs 153 are respectively connected to the edges of the two opposite sides of the main body 152, so that the two engaging lugs 153 can exert forces on the two opposite sides of the main body 152, and the main body 152 can be stably disposed in the housing 11 of the terminal.

In some other embodiments of this application, as shown in FIG. 4, the two engaging lugs 153 are respectively located at two opposite ends of a diagonal line of the main body 152. Specifically, on the basis of the foregoing embodiment, the two engaging lugs 153 are respectively located at the two opposite ends of the diagonal line of the main body 152. Therefore, the two engaging lugs 153 are respectively located on two opposite sides in a width direction of the main body 152, and the two engaging lugs 153 are also respectively located on two opposite sides in a length direction of the main body 152, so that the two engaging lugs 153 can exert forces on the two opposite sides in the length direction and the two opposite sides in the width direction of the main body 152, and the main body 152 can be more stably disposed in the housing 11 of the terminal.

Figure 21:
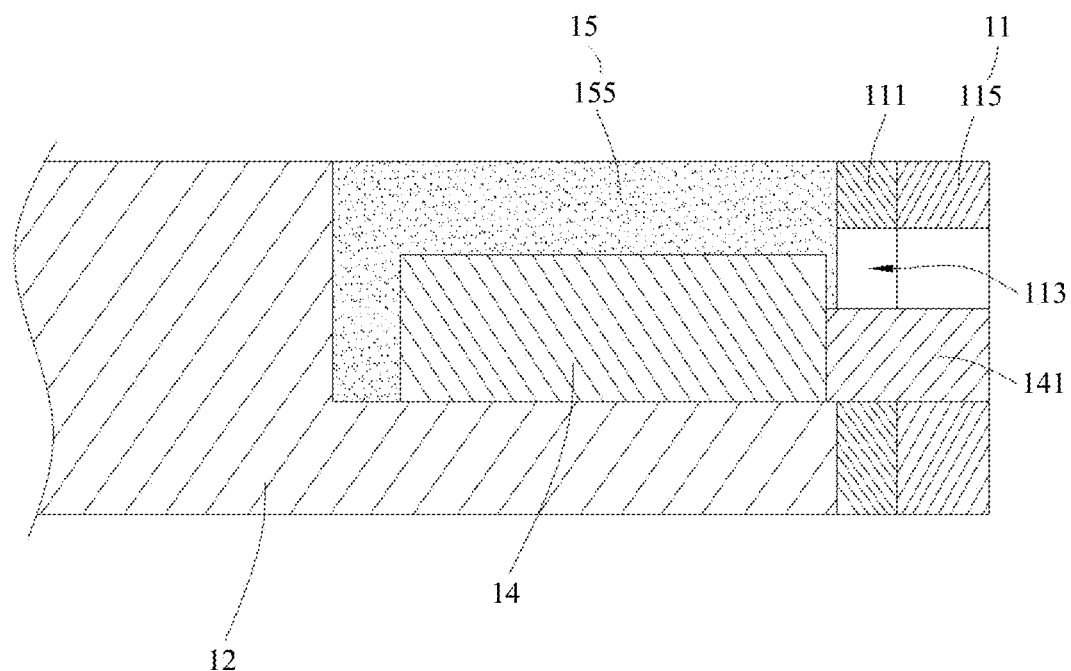
FIG. 21 is a fourth section view of a projection, a sealing plate, and an interface component in a terminal device in a thickness direction of the projection according to an embodiment of this application.

In some other embodiments of this application, as shown in FIG. 9 and FIG. 21, the sealing kit 15 includes a sealing glue 155, and the sealing glue 155 is filled in the isolation groove 13. The interface component 14 is sealed in the sealing glue 155. Specifically, in this embodiment, the sealing kit 15 is the sealing glue 155, and the sealing glue 155 is directly filled in the isolation groove 13, so that the interface component 14 is sealed in the isolation groove 13. In this way, sealing costs of the interface component 14 are better reduced, and overall waterproof implementation costs of the terminal device 10 are better reduced.

The flexible printed circuit 142 of the interface component 14 in this embodiment of this application is directly connected to a BTB interface on the circuit board 112, so the flexible printed circuit 142 is separately configured for the interface component 14, thus facilitating rapid assembly of the interface component 14 in the housing 11.

For example, the flexible printed circuit 142 of the interface component 14 may be connected to the BTB interface on the circuit board 112 in advance, and then the sealing glue 155 is filled into the isolation groove 13. In this way, the sealing glue 155 may also protect and fasten the flexible printed circuit 142. For example, the sealing glue 155 and the waterproof glue 154 each may be an instantaneous adhesive, a UV (Ultraviolet Ray) glue, a hot melt adhesive, or the like.

The foregoing descriptions are merely examples of embodiments of this application, but are not intended to limit this application. Any modification, equivalent replacement, improvement, and the like made within the spirit and principle of this application shall fall within the protection scope of this application.

The invention claimed is:

1. A terminal device, comprising:
   a housing, wherein an isolation groove is formed in an inner wall of the housing, the isolation groove has a first opening, and the first opening is exposed to the housing;
   a circuit board, wherein the circuit board is disposed in the housing; and
   an interface component, wherein the interface component is sealed in the isolation groove through a sealing kit, the interface component is electrically connected to the circuit board, and an interface end of the interface component is exposed to the first opening;
   wherein the isolation groove has a second opening, the second opening is located inside the housing, the sealing kit comprises a sealing plate and a sealing glue, the interface component is sealed in the sealing glue, and the sealing plate is disposed at the second opening and is configured to seal the second opening, wherein the sealing plate comprises a main body and engaging lugs, the main body is disposed at the second opening, a gap is formed between a peripheral edge of the main body and a groove wall of the isolation groove, the gap is filled with a waterproof glue, the engaging lugs are connected to an edge of the main body and are connected to the circuit board through screws.

2. The terminal device according to claim 1, wherein a support stand is disposed at a position that is on the groove wall of the isolation groove and that is close to the second opening, and the peripheral edge of the main body is disposed on the support stand.

3. The terminal device according to claim 1, wherein a projection is formed on the inner wall of the housing, and the isolation groove is disposed in the projection.

4. The terminal device according to claim 3, wherein the sealing plate comprises the main body and the engaging lugs, the main body covers the second opening, the peripheral edge of the main body and a position that is on the projection and that is located at a peripheral edge of the second opening are hermetically connected, and the engaging lugs are connected to the edge of the main body and are connected to the circuit board through the screws.

5. The terminal device according to claim 4, wherein the main body and the position that is of the projection and that is located at the peripheral edge of the second opening are hermetically connected through the waterproof glue.

6. The terminal device according to claim 4, wherein a second caulking groove is disposed at a position that is on the projection and that is at the peripheral edge of the second opening, a second sealing strip is disposed in the second caulking, and the second sealing strip presses against a surface that is of the main body and that faces the isolation groove.

7. The terminal device according to claim 1, wherein the interface component has a flexible printed circuit, and the flexible printed circuit extends out of the isolation groove and is connected to a board to board connector of the circuit board.

8. The terminal device according to claim 1, wherein a quantity the engaging lugs is two, and the two engaging lugs are respectively connected to edges of two opposite sides of the main body.

9. The terminal device according to claim 1, wherein the two engaging lugs are respectively located at two opposite ends of a diagonal line of the main body.

10. The terminal device according to claim 1, wherein the sealing plate comprises a main body and engaging lugs, the main body is disposed at the second opening, a support stand is disposed at a position that is on a groove wall of the isolation groove and that is close to the second opening, a peripheral edge of the main body is disposed on the support stand, a first caulking groove is disposed on a surface of the support stand, a first sealing strip is disposed in the first caulking groove, the first sealing strip presses against a surface that is of the main body and that faces the isolation groove, and the engaging lugs are connected to an edge of the main body and are connected to the circuit board through screws.

11. The terminal device according to claim 1, wherein the sealing glue is filled in the isolation groove.

12. The terminal device according to claim 1, wherein the interface component is a universal serial bus interface.

* * * * *